(12) United States Patent
Park et al.

(10) Patent No.: US 9,660,595 B2
(45) Date of Patent: May 23, 2017

(54) LINEAR AMPLIFIER USING NONLINEAR AMPLIFYING STAGE

(71) Applicant: SOONGSIL UNIVERSITY RESEARCH CONSORTIUM TECHNO-PARK, Seoul (KR)

(72) Inventors: Chang Kun Park, Gyeonggi-do (KR); Jong Hoon Park, Seoul (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 14/972,105

(22) Filed: Dec. 17, 2015

(65) Prior Publication Data

US 2016/0204745 A1    Jul. 14, 2016

(30) Foreign Application Priority Data

Jan. 12, 2015   (KR) ......................... 10-2015-0004363

(51) Int. Cl.
| | |
|---|---|
| *H03G 3/20* | (2006.01) |
| *H03F 1/56* | (2006.01) |
| *H03F 3/193* | (2006.01) |
| *H03F 1/02* | (2006.01) |
| *H03F 1/32* | (2006.01) |
| *H03G 3/30* | (2006.01) |

(52) U.S. Cl.
CPC ............. *H03F 1/56* (2013.01); *H03F 1/0261* (2013.01); *H03F 1/3276* (2013.01); *H03F 3/193* (2013.01); *H03G 3/3042* (2013.01); *H03F 2200/18* (2013.01); *H03F 2200/411* (2013.01); *H03F 2200/451* (2013.01)

(58) Field of Classification Search
CPC ........................................................ H03G 3/20
USPC ......................................... 330/133, 98, 302
See application file for complete search history.

(56) References Cited

U.S. PATENT DOCUMENTS

| | | | | |
|---|---|---|---|---|
| 2002/0057131 | A1* | 5/2002 | Matsushita | ........... H03F 1/0233 330/133 |
| 2003/0016082 | A1* | 1/2003 | Matsunaga | ........... H03F 1/0261 330/133 |
| 2005/0146379 | A1* | 7/2005 | Sugiyama | ............ H03G 3/3047 330/133 |
| 2005/0168281 | A1* | 8/2005 | Nagamori | ............... H03F 1/301 330/133 |
| 2005/0200407 | A1* | 9/2005 | Arai | ....................... H03G 3/004 330/133 |

(Continued)

FOREIGN PATENT DOCUMENTS

KR      2002-0074784 A      10/2002

*Primary Examiner* — Henry Choe
(74) *Attorney, Agent, or Firm* — Revolution IP, PLLC (57) ABSTRACT

Disclosed herein is a linear amplifier using a nonlinear amplifying stage which includes a first amplifier and a second amplifier connected in cascade, including: a bias voltage generator in which a first bias voltage is applied to a gate terminal of the first amplifier, and a second bias voltage higher than the first bias voltage is applied to a gate terminal of the second amplifier, wherein the first amplifier and the second amplifier have a nonlinear gain characteristic in a region of arbitrary output power, and as the output power increases in the region of arbitrary output power, a gain of the first amplifier increases, while a gain of the second amplifier decreases.

8 Claims, 5 Drawing Sheets

(56) References Cited

U.S. PATENT DOCUMENTS

2006/0066398 A1* 3/2006 Akamine .................. H03F 1/30
330/133
2009/0179698 A1* 7/2009 Ichitsubo ............. H03G 3/3036
330/133

* cited by examiner

LINEAR AMPLIFIER USING NONLINEAR AMPLIFYING STAGE

CROSS-REFERENCE TO RELATED APPLICATION

This application claims priority to and the benefit of Korean Patent Application No. 10-2015-0004363 filed in the Korean Intellectual Property Office on Jan. 12, 2015, the entire contents of which are incorporated herein by reference.

BACKGROUND OF THE DISCLOSURE

1. Field of the Disclosure

The present disclosure relates to a liner amplifier using a nonlinear amplifying stage, and more particularly, to a linear amplifier using a nonlinear amplifying stage in which a multi-amplifying stage formed in cascade is implemented to have a nonlinear characteristic, and final output power of an amplifier is implemented to have a linear characteristic.

2. Description of the Related Art

Generally, a power amplifier used in a wireless terminal is formed of an amplifier consisting of two or more stages, thereby securing power required from the power amplifier or a voltage gain. For example, a two-stage power amplifier is formed of a drive-amplifying stage and a power-amplifying stage. The drive-amplifying stage serves to drive the power-amplifying stage so as to secure a gain of an entire power amplifier, and then the power-amplifying stage serves to obtain a value in which final output power is required.

In the case of the power amplifier, since the final output power is determined depending on how the power-amplifying stage is designed, a design of the power-amplifying stage is significantly important. Generally, the drive-amplifying stage is designed to secure a high power gain, and the power-amplifying stage is designed to secure high output power.

One of core design purposes of the power amplifier is to secure linearity between input power and output power. Since the output power and the linearity are mutually in a trade-off relationship, it is significantly difficult to secure the high output power while maintaining the high linearity. Therefore, the entire linearity of the power amplifier is determined in accordance with not the drive-amplifying stage having low output power but the power-amplifying stage having the high output power.

Figure 1:
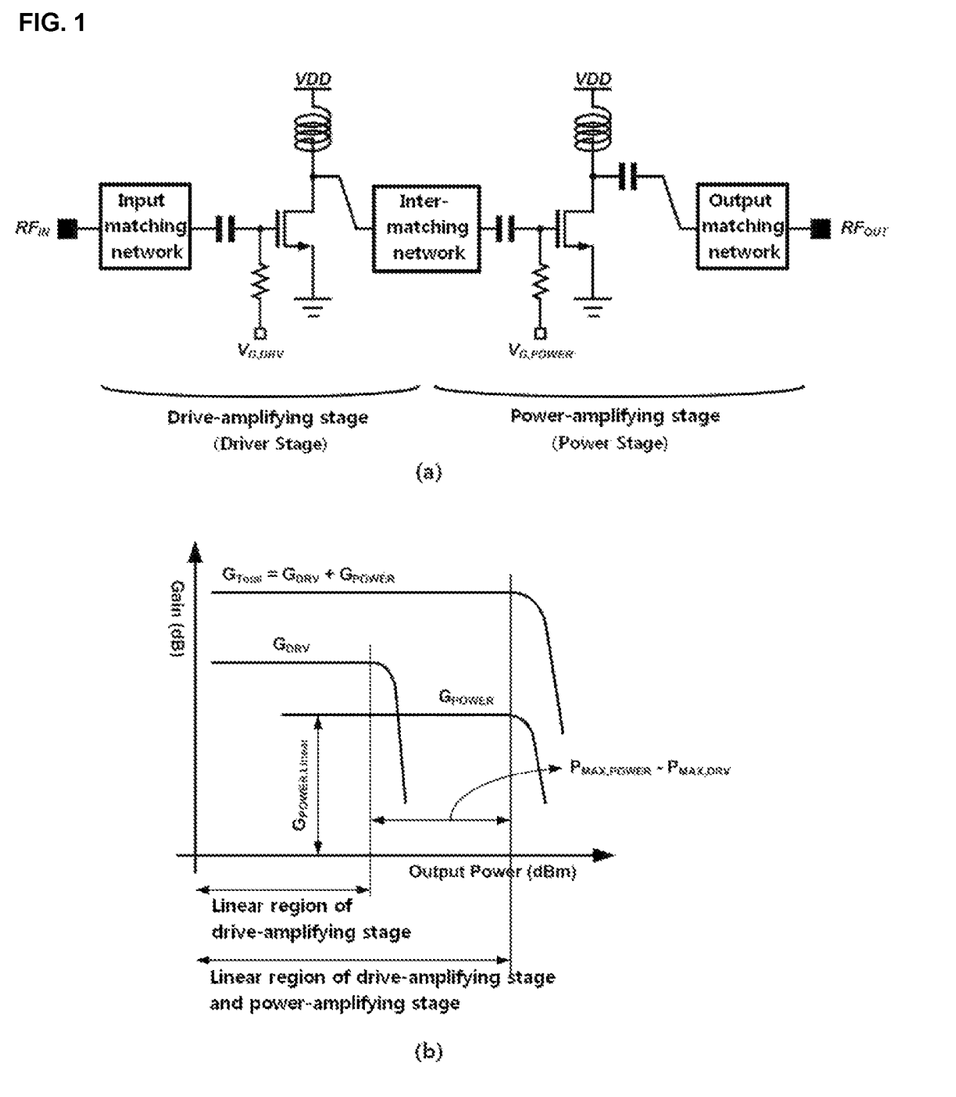
FIG. 1 is a drawing illustrating a structure and a gain characteristic of a power amplifier according to a related art.

FIG. 1 is a drawing illustrating a structure and a gain characteristic of a power amplifier according to a related art. Part (a) of FIG. 1 illustrates a simplified circuit diagram of a two-stage power amplifier formed in a MOSFET, and part (b) of FIG. 1 illustrates a power gain curve according to Part (a) of FIG. 1.

In part (a) of FIG. 1, a drive-amplifying stage and a power-amplifying stage are connected in cascade. An input matching network is formed at a front end of the drive-amplifying stage and an inter-matching network is formed between the drive-amplifying stage and the power-amplifying stage, and an output matching network is formed at a rear end of the power-amplifying stage.

Referring to part (b) of FIG. 1, in the power gain curve, $G_{total}$ represents a final power gain of the two-stage power amplifier. Further, $G_{drv}$ represents a power gain of the drive-amplifying stage, and $G_{power}$ represents a gain of the power-amplifying stage.

As described above, the drive-amplifying stage of the power amplifier according to the related art has the relatively high power gain, and the power-amplifying stage is designed to generate the high output power instead of having the relatively low power gain. In this case, the drive-amplifying stage and the power-amplifying stage are respectively provided with a linear region. The sum of the power gain in the linear regions of respective amplifying stages becomes $G_{total}$ representing the power gain of a final power amplifier.

In the case of a general amplifying stage, as a gate bias voltage increases, the power gain in a low output power region increases. The amplifier according to the related art is designed to select the gate bias voltage in which the linear region can be secured the most. However, as a method to secure the linear region further widely, the related art uses the method of sacrificing the power gain and of increasing a transistor size of the power-amplifying stage.

In this case, since the method of sacrificing the power gain additionally requires the drive-amplifying stage to compensate the reduced power gain, which results in several drawbacks that DC power consumption is increased, and efficiency of the entire amplifier is reduced, and an entire IC area and production cost are increased. In addition, since the method of increasing the transistor size of the power-amplifying stage also requires the drive-amplifying stage, which leads to several drawbacks that the production cost is increased, and efficiency of power conversion is reduced, and the efficiency of the power conversion in the low output power region excessively deteriorates.

A background technique of the present disclosure is disclosed in Korean Patent Laid-Open Publication No. 2002-0074784 (Published on Oct. 4, 2002).

The above information disclosed in this Background section is only for enhancement of understanding of the background of the disclosure and therefore it may contain information that does not form the prior art that is already known in this country to a person of ordinary skill in the art.

SUMMARY OF THE DISCLOSURE

The present disclosure has been made in an effort to provide a linear amplifier using a nonlinear amplifying stage in which a multi-amplifying stage formed in cascade is implemented to have a nonlinear characteristic, and final output power of an amplifier is implemented to have a linear characteristic.

An exemplary embodiment of the present disclosure provides a linear amplifier using a nonlinear amplifying stage which includes a first amplifier and a second amplifier connected in cascade, including: a bias voltage generator in which a first bias voltage is applied to a gate terminal of the first amplifier, and a second bias voltage higher than the first bias voltage is applied to a gate terminal of the second amplifier, wherein the first amplifier and the second amplifier have a nonlinear gain characteristic in a region of arbitrary output power, and as the output power increases in the region of the arbitrary output power, a gain of the first amplifier increases, while a gain of the second amplifier decreases.

Another embodiment of the present disclosure provides a linear amplifier using a nonlinear amplifying stage which includes a first amplifier and a second amplifier connected in cascade, including: a bias voltage generator in which a first bias voltage is applied to a gate terminal of the first amplifier, and a second bias voltage lower than the first bias voltage is applied to a gate terminal of the second amplifier, wherein the first amplifier and the second amplifier have a nonlinear gain characteristic in a region of arbitrary output power, and as the output power increases in the region of arbitrary output power, a gain of the first amplifier decreases, while a gain of the second amplifier increases.

The sum of a nonlinear gain of the first amplifier and a nonlinear gain of the second amplifier may represent a linear gain characteristic in the region of the arbitrary output power.

The first amplifier may be a drive amplifier, and the second amplifier is a power amplifier.

The bias voltage generator may include: a first power terminal to which a first power is applied; a second power terminal to which a second power higher than the first power is applied; a first resistor, a first terminal of which is connected to the first power terminal and a second terminal of which is connected to the gate terminal of the first amplifier; a second resistor, the first terminal of which is connected to the gate terminal of the first amplifier and the second terminal of which is connected to the gate terminal of the second amplifier; and a third resistor, the first terminal of which is connected to the gate terminal of the second amplifier and the second terminal of which is connected to the second power terminal.

A gain of the first amplifier may be formed to be lower than that of the second amplifier in a low power region of the arbitrary output power.

The bias voltage generator may include: a first power terminal to which a first power is applied; a second power terminal to which a second power lower than the first power is applied; a first resistor, a first terminal of which is connected to the first power terminal and a second terminal of which is connected to the gate terminal of the first amplifier; a second resistor, the first terminal of which is connected to the gate terminal of the first amplifier and the second terminal of which is connected to the gate terminal of the second amplifier; and a third resistor, the first terminal of which is connected to the gate terminal of the second amplifier and the second terminal of which is connected to the second power terminal.

A gain of the first amplifier may be formed to be higher than that of the second amplifier in a low power region of the arbitrary output power.

According to embodiments of the present disclosure, it is advantageously possible not only to secure linearity of an amplifier and but also to improve efficiency of power conversion by implementing each amplifying stage formed in cascade to have a nonlinear characteristic and final output power to have a linear characteristic.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

The present disclosure will be described more fully hereinafter with reference to the accompanying drawings, in which exemplary embodiments of the disclosure are shown.

The present disclosure provides a linear amplifier using a nonlinear amplifying stage in which the gate bias of each of a drive-amplifying stage and a power-amplifying stage formed in cascade is respectively adjusted such that all of the two amplifying stages have a nonlinear characteristic. Simultaneously, final output power of the amplifier is implemented to have a linear characteristic with respect to input power, thereby not only guaranteeing linearity of the amplifier but also improving efficiency of power conversion.

An exemplary embodiment of the present disclosure is classified into two cases. The first case is that a bias value of the drive-amplifying stage is configured to be lower than that of the power-amplifying stage, while the second case is that the bias value of the power-amplifying stage is configured to be lower than that of the drive-amplifying stage. In the case of the above-mentioned two cases, the final output power of the amplifier can be implemented to satisfy the linear characteristic with respect to the input power.

Figure 2:
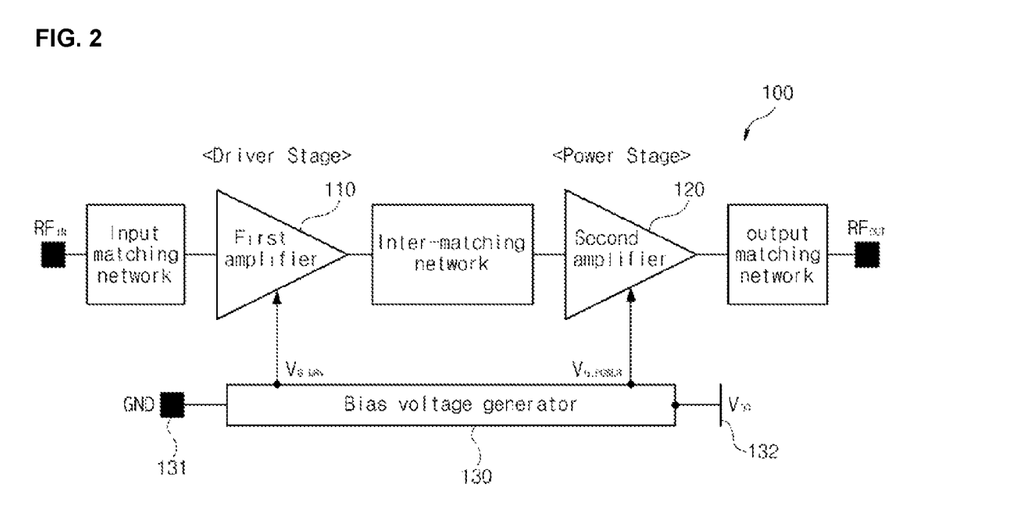
FIG. 2 is a drawing illustrating a structure of a linear amplifier according to a first exemplary embodiment of the present disclosure.

First, a linear amplifier according to a first exemplary embodiment of the present disclosure will now be described in detail. FIG. 2 is a drawing illustrating a structure of a linear amplifier according to a first exemplary embodiment of the present disclosure.

Referring to FIG. 2, a linear amplifier 100 according to the first exemplary embodiment of the present disclosure includes: a first amplifier 110 a second amplifier 120 connected in cascade, and a bias voltage generator 130 that generates a bias voltage to be applied to a gate terminal of each of the amplifiers 110 and 120.

Here, it is exemplified that the first amplifier 110 is a drive amplifier and the second amplifier 120 is a power amplifier. Hereinafter, in the exemplary embodiment of the present disclosure, although a two-stage amplifier formed in a MOSFET is exemplarily described, the same principle can be applied to a multi-stage amplifier consisting of a plurality of transistors such as a BJT, an HBT, a pHEMT, and an LDMOS except the MOSFET.

Each amplifier may be formed in a differential amplifier or may be formed in a single-ended amplifier. In the exemplary embodiment of the present disclosure, the same principle may be applied thereto regardless of a form of the amplifier. Further, each amplifier may be a common-source structure, or may be a cascode structure that uses the common-source structure and a common-gate structure together so as to improve a voltage gain and secure reliability.

According to the present exemplary embodiment, the respective amplifiers 110 and 120 are implemented to have a nonlinear gain characteristic in a region of arbitrary output power by using the bias voltage applied to the gate terminal of each of the amplifiers 110 and 120. In this case, the nonlinear gain characteristics of the two amplifiers 110 and 120 have opposite aspects each other such that the final output power generated by the two amplifiers 110 and 120 can have a linear gain characteristic.

In the case of the first exemplary embodiment of the present disclosure, the bias voltage generator 130 applies a first bias voltage ($V_{G,DRV}$) to the gate terminal of the first amplifier 110 and applies a second bias voltage ($V_{G,POWER}$) to the gate terminal of the second amplifier 120. In this case, the second bias voltage ($V_{G,POWER}$) has a greater value than that of the first bias voltage ($V_{G,DRV}$).

Accordingly, all of the first amplifier 110 and the second amplifier 120 are implemented to have the nonlinear gain characteristic. Further, simultaneously, the first amplifier 110 is implemented to gradually increase the gain with respect to the output power and the second amplifier 120 is implemented to gradually reduce the gain with respect thereto.

Figure 3:
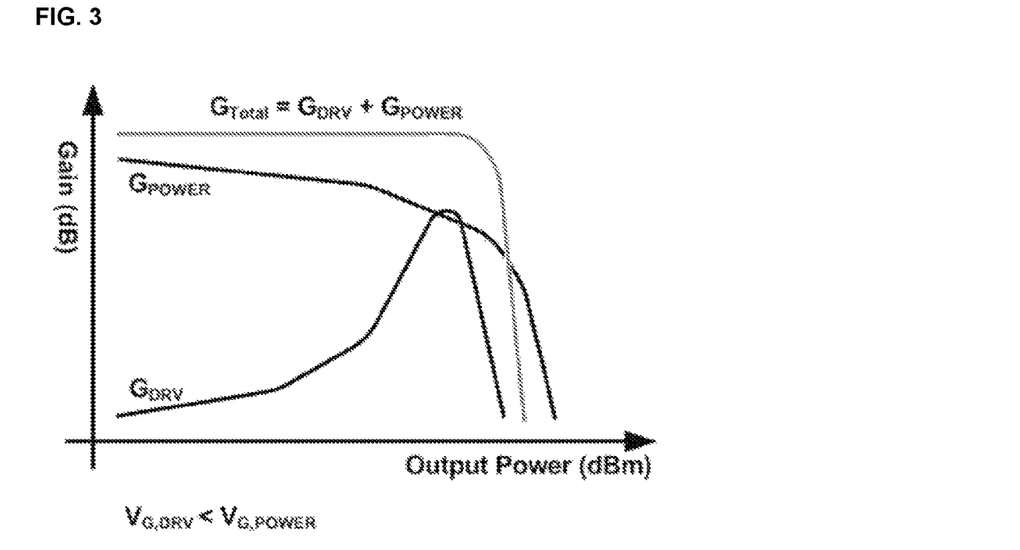
FIG. 3 is a drawing illustrating a power gain characteristic of each amplifier and a power gain characteristic of an entire amplifier in a first exemplary embodiment of the present disclosure.

FIG. 3 is a drawing illustrating a power gain characteristic of each amplifier and a power gain characteristic of an entire amplifier in a first exemplary embodiment of the present disclosure. Referring to FIG. 3, as the gate bias voltage of each of the amplifiers 110 and 120 is adjusted, the first amplifier 110 and the second amplifier 120 can respectively have the nonlinear gain characteristic in the region of the arbitrary output power. That is, the first amplifier 110 and the second amplifier 120 hardly have a linear region.

Additionally, in the case of the first amplifier 110, as the output power increases, a variation of the gain increases. In contrast, in the case of the second amplifier 120, as the output power increases, the variation of the gain decreases. According to the above-mentioned description, the sum ($G_{TOTAL}$) of a nonlinear gain ($G_{DRV}$) of the first amplifier 110 and a nonlinear gain ($G_{POWER}$) of the second amplifier 120 can represent the linear gain characteristic in the region of the arbitrary output power.

As such, when the gate bias voltage with regard to the two amplifies 110 and 120 is properly adjusted, each of $G_{DRV}$ and $G_{POWER}$ has the nonlinear characteristic with a very small amount of the linear region. However, $G_{DRV}+G_{POWER}$ (=$G_{TOTAL}$), as shown in FIG. 3, can search for a condition in which the linear region exists.

Here, according to the exemplary embodiment of the present disclosure, when the gate bias voltage applied to the amplifier is adjusted, a form of a gain curve of the amplifier varies such that each of the amplifiers 110 and 120 can operate not in the linear region but in the nonlinear region. A specific principle will hereinafter be described.

Figure 4:
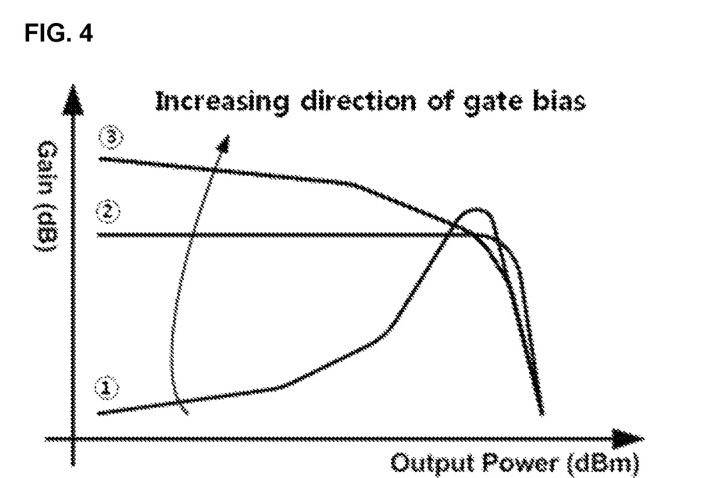
FIG. 4 is a drawing illustrating a variation of a gain characteristic depending on a bias voltage size applied to a gate terminal of an amplifier in an exemplary embodiment of the present disclosure.

FIG. 4 is a drawing illustrating a variation of a gain characteristic depending on a bias voltage size applied to a gate terminal of an amplifier in an exemplary embodiment of the present disclosure. Referring to FIG. 4, it can be seen that when a bias voltage applied to the gate terminal of the amplifier is small, a power gain in low output power is low (refer to graph ①). Here, when the bias voltage is increased to a certain extent, it may be converted to have the linear gain characteristic in the region of the arbitrary output power (refer to graph ②). In addition, when the bias voltage is further increased, it is converted again to have the nonlinear gain characteristic. In this case, the power gain in the low output power is high (refer to graph ③).

The amplifier according to a related art uses a method of respectively searching for the gate bias voltage in which the linear region is secured the most, and of accordingly operating each amplifier in the linear region. However, the exemplary embodiment of the present disclosure, contrary to the related art, does not have a limited condition that each amplifying stage should have the linear region.

As the related art, when each amplifying stage essentially secures the linear region, a drawback that each amplifier should sacrifice a size of the output power or efficiency of power conversion in a trade-off relationship may occur. In contrast, according to the exemplary embodiment of the present disclosure, the gate bias voltage of each amplifier is individually adjusted such that the two amplifiers are implemented to operate in the nonlinear region, thereby preventing a deterioration problem of the size of the output power or the efficiency. Simultaneously, the sum of the nonlinear gain of the two amplifiers can be adjusted to be the linear gain such that an entire amplifier can be implemented to linearly operate.

Figure 5:
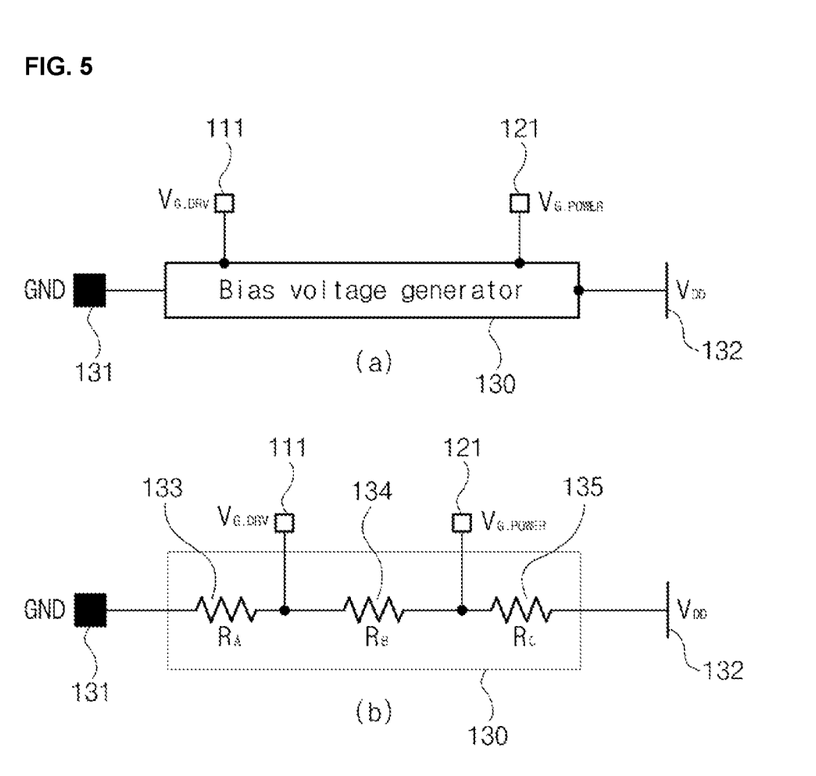
FIG. 5 is a drawing illustrating a configuration of a bias voltage generator for a first exemplary embodiment of the present disclosure.

Configuration of a bias voltage generator will now be described in detail. FIG. 5 is a drawing illustrating configuration of a bias voltage generator for a first exemplary embodiment of the present disclosure. Referring to FIG. 5, a bias voltage generator 130 includes a first power terminal 131, a second power terminal 132, a first resistor 133, a second resistor 134, and a third resistor 135.

First power (e.g., GND) is applied to the first power terminal 131, and second power (e.g., VDD) higher than the first power is applied to the second power terminal 132. The first to third resistor 133, 134, and 135 are serially connected between the first power terminal 131 and the second power terminal 132.

In the first resistor ($R_A$) 133, a first terminal is connected to the first power terminal 131, and a second terminal is connected to a gate terminal 111 of the first amplifier 110. In the second resistor ($R_B$) 134, the first terminal is connected to the gate terminal ($V_{G,DRV}$) 111 of the first amplifier 110, and the second terminal is connected to a gate terminal 121 of the second amplifier 120. In the third resistor ($R_C$) 135, the first terminal is connected to the gate terminal 121 of the second amplifier 120, and the second terminal is connected to the second power terminal 132.

According to a voltage division rule, the first bias voltage ($V_{G,DRV}$) applied to the gate terminal 111 of the first amplifier 110 is formed with a smaller value than that of the second bias voltage ($V_{G,POWER}$) applied to the gate terminal 121 of the second amplifier 120. In the case of the first amplifier 110, since the bias voltage is low, as shown in FIG. 3, the gain characteristic can be adjusted in a similar form to graph ① of FIG. 4. Further, in the case of the second amplifier 120, since the bias voltage is high, the gain characteristic can be adjusted in a similar form to graph ③ of FIG. 4.

According to the method described above, the gain ($G_{DRV}$) of the first amplifier 110 is formed to be lower than the gain ($G_{POWER}$) of the second amplifier 120 in a low power region of the arbitrary output power. Since a varying-form of the gain in corresponding output power is contrary to each other, the sum ($_{TOTAL}$) of the two gains can have the linear characteristic.

In the exemplary embodiment of the present disclosure, the configuration of the bias voltage generator is not limited to FIG. 5, and exemplary variations may exist in similar methods.

Figure 6:
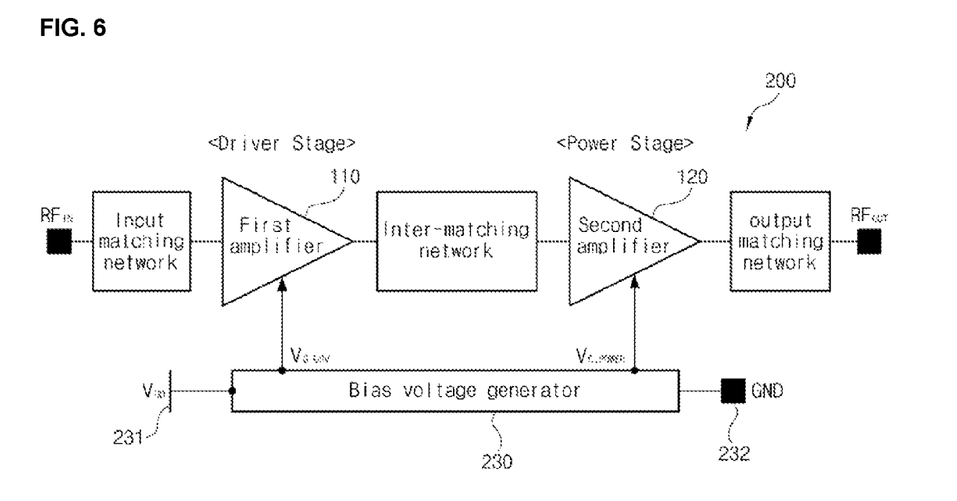
FIG. 6 is a drawing illustrating a structure of a liner amplifier according to a second exemplary embodiment of the present disclosure.

A linear amplifier according to a second exemplary embodiment of the present disclosure will now be described in detail. FIG. 6 is a drawing illustrating a structure of a liner amplifier according to a second exemplary embodiment of the present disclosure. A linear amplifier 200 according to the second exemplary embodiment of the present disclosure includes the first amplifier 110 and the second amplifier 120 connected in cascade, and a bias voltage generator 230 that generates the bias voltage applied to the gate terminal of each of the amplifiers 110 and 120.

In the case of the second exemplary embodiment, contrary to the first exemplary embodiment, the first bias voltage ($V_{G,DRV}$) has a greater value than that of the second bias voltage($V_{G,POWER}$). Accordingly, all of the first amplifier 110 and the second amplifier 120 are implemented to have the nonlinear gain characteristic. Further, simultaneously, the first amplifier 110 is implemented to gradually reduce the gain with respect to the output power, whereas the second amplifier 120 is implemented to gradually increase the gain with respect thereto.

Figure 7:
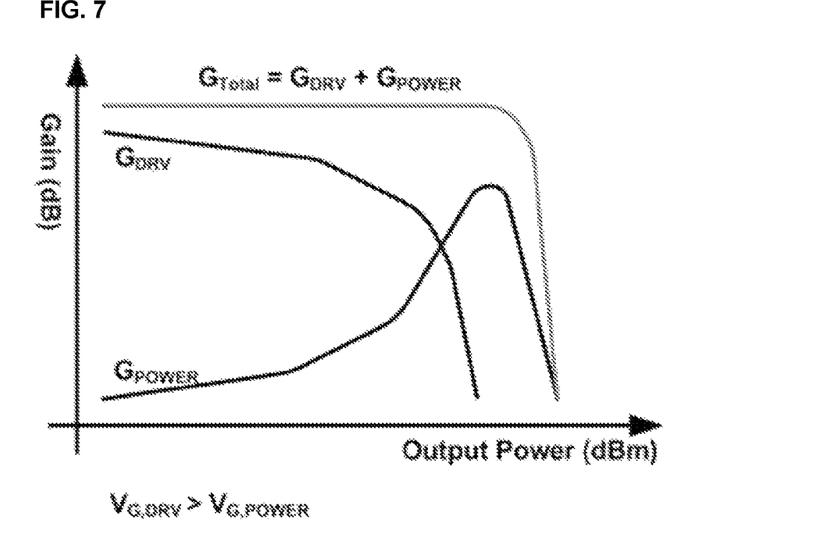
FIG. 7 is a drawing illustrating a power gain characteristic of each amplifier and a power gain characteristic of an entire amplifier in a second exemplary embodiment of the present disclosure.

FIG. 7 is a drawing illustrating a power gain characteristic of each amplifier and a power gain characteristic of an entire amplifier in a second exemplary embodiment of the present disclosure. Referring to FIG. 7, as the gate bias voltage of each of the amplifiers 110 and 120 is adjusted, all of the first and second amplifier 110 and 120 can have the nonlinear gain characteristic in the region of the arbitrary output power. That is, the first amplifier 110 and the second amplifier 120 hardly have the linear region.

Further, in the case of the first amplifier 110, as the output power increases, the variation of the gain decreases. In contrast, in the case of the second amplifier 120, as the output power increases, the variation of the gain increases.

Accordingly, it can be seen that the sum ($G_{TOTAL}$) of the nonlinear gain ($G_{DRV}$) of the first amplifier 110 and the nonlinear gain ($G_{POWER}$) of the second amplifier 120 represents the linear gain characteristic in corresponding output power.

Figure 8:
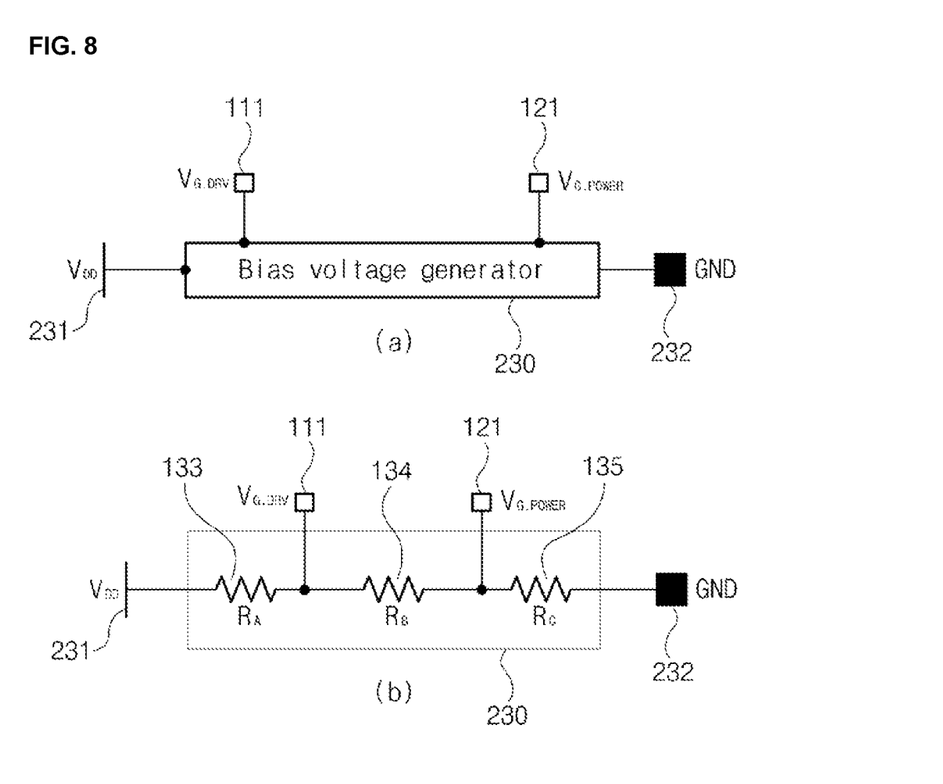
FIG. 8 is a drawing illustrating a configuration of a bias voltage generator for a second exemplary embodiment of the present disclosure.

FIG. 8 is a drawing illustrating configuration of a bias voltage generator for a second exemplary embodiment of the present disclosure. Referring to FIG. 8, the bias voltage generator 230 includes a first power terminal 231, a second power terminal 232, a first resistor 233, a second resistor 234, and a third resistor 235.

The first power (e.g., VDD) is applied to the first power terminal 231, and the second power (e.g., GND) lower than the first power is applied to the second power terminal 232. The first to third resistor 233, 234, and 235 are serially connected between the first power terminal 231 and the second power terminal 232. Since connection relationships of the first to third resistor 233, 234, and 235 are the same as the first exemplary embodiment, a detailed description thereof will be omitted.

According to the voltage division rule, the second bias voltage ($V_{G,POWER}$) applied to the gate terminal 121 of the second amplifier 120 is formed with a smaller value than that of the first bias voltage ($V_{G,DRV}$) applied to the gate terminal 111 of the first amplifier 110. In the case of the second amplifier 120, since the bias voltage is low, as shown in FIG. 7, the gain characteristic can be adjusted in the similar form to graph ① of FIG. 4. Further, in the case of the first amplifier 110, since the bias voltage is high, the gain characteristic can be adjusted in the similar form to graph ③ of FIG. 4.

According to the method described above, as shown in FIG. 7, the gain ($G_{DRV}$) of the first amplifier 110 is formed to be higher than that of the gain ($G_{POWER}$) of the second amplifier 120 in the low power region of the arbitrary output power. Since the varying-form of the gain in the region of the arbitrary output power is contrary to each other, the sum ($G_{TOTAL}$) of the two gains can have the linear characteristic.

As described above, the amplifier according to the exemplary embodiment of the present disclosure nonlinearly forms the power gain curve of each amplifying stage formed in cascade, thereby improving the characteristics such as the efficiency of the power conversion and the power gain that are in the trade-off relationship with the linearity. Further, simultaneously, the sum of a nonlinear power gain of the drive-amplifying stage and the power-amplifying stage secures the linear region such that the entire amplifier not only guarantees the linear region and but also improves the efficiency of the power conversion or a power gain value.

As a result, according to the exemplary embodiment of the present disclosure, it is advantageously possible not only to secure the linearity of the amplifier and but also to improve the efficiency of the power conversion by implementing each amplifying stage formed in cascade to have the nonlinear characteristic and the final output power to have the linear characteristic.

While the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scoop of the appended claims. Accordingly, the scoop of the present disclosure shall be determined only according to the attached claims.

What is claimed is:

1. A linear amplifier using multi-amplifying stage in cascade, comprising:
   a first amplifier and a second amplifier;
   a bias voltage generator comprising a first bias voltage and a second bias voltage, and the first bias voltage being applied to a gate terminal of the first amplifier, and the second bias voltage being applied to a gate terminal of the second amplifier, the second bias voltage greater than the first bias voltage, wherein
   the first amplifier and the second amplifier output a nonlinear gain characteristic, respectively in a region of arbitrary output power, and in response to detection of the output power increasing in the region of the arbitrary output power, a gain of the first amplifier increases, while a gain of the second amplifier decreases, and wherein
   the sum of the nonlinear gain of the first amplifier and the nonlinear gain of the second amplifier represents a linear gain characteristic corresponding to the region of arbitrary output power.

2. The linear amplifier using the nonlinear amplifying stage of claim 1, wherein the first amplifier is a drive amplifier, and the second amplifier is a power amplifier.

3. The linear amplifier using the nonlinear amplifying stage of claim 1, wherein the bias voltage generator further comprises:
   a first power terminal to which a first power is applied;

a second power terminal to which a second power greater than the first power is applied;

a first resistor, a first terminal of which is connected to the first power terminal and a second terminal of which is connected to the gate terminal of the first amplifier;

a second resistor, the first terminal of which is connected to the gate terminal of the first amplifier and the second terminal of which is connected to the gate terminal of the second amplifier; and a third resistor, the first terminal of which is connected to the gate terminal of the second amplifier and the second terminal of which is connected to the second power terminal.

4. The linear amplifier using the nonlinear amplifying stage of claim 3, wherein a gain of the first amplifier is lower than that of the second amplifier in a low power region of the arbitrary output power.

5. A linear amplifier using multi-amplifying stage in cascade, comprising:

a first amplifier and a second amplifier;

a bias voltage generator comprising a first bias voltage and a second bias voltage, and the first bias voltage being applied to a gate terminal of the first amplifier, and the second bias voltage being applied to a gate terminal of the second amplifier, the second bias voltage less than the first bias voltage, wherein the first amplifier and the second amplifier output a nonlinear gain characteristic, respectively in a region of arbitrary output power, and in response to detection of the output power increasing in the region of the arbitrary output power, a gain of the first amplifier decreases, while a gain of the second amplifier increases, and wherein the sum of the nonlinear gain of the first amplifier and the nonlinear gain of the second amplifier represents a linear gain characteristic corresponding to the region of arbitrary output power.

6. The linear amplifier using the nonlinear amplifying stage of claim 5, wherein the first amplifier is a drive amplifier, and the second amplifier is a power amplifier.

7. The linear amplifier using the nonlinear amplifying stage of claim 5, wherein the bias voltage generator further comprises:

a first power terminal to which a first power is applied;

a second power terminal to which a second power less than the first power is applied;

a first resistor, a first terminal of which is connected to the first power terminal and a second terminal of which is connected to the gate terminal of the first amplifier;

a second resistor, the first terminal of which is connected to the gate terminal of the first amplifier and the second terminal of which is connected to the gate terminal of the second amplifier; and a third resistor, the first terminal of which is connected to the gate terminal of the second amplifier and the second terminal of which is connected to the second power terminal.

8. The linear amplifier using the nonlinear amplifying stage of claim 7, wherein a gain of the first amplifier is higher than that of the second amplifier in a low power region of the arbitrary output power.

* * * * *